(12) United States Patent
Schaper

(10) Patent No.: US 8,703,406 B2
(45) Date of Patent: Apr. 22, 2014

(54) METHOD OF FORMING LARGE-AREA MASTERS FOR REPLICATION OF TRANSFER LITHOGRAPHY TEMPLATES

(75) Inventor: Charles D. Schaper, Union City, CA (US)

(73) Assignee: Transfer Devices Inc., Santra Clara, CA (US)

( * ) Notice: Subject to any disclaimer, the term of this patent is extended or adjusted under 35 U.S.C. 154(b) by 74 days.

(21) Appl. No.: 13/547,266

(22) Filed: Jul. 12, 2012

(65) Prior Publication Data
US 2014/0017614 A1 Jan. 16, 2014

(51) Int. Cl.
*G03F 7/00* (2006.01)
(52) U.S. Cl.
USPC ............ 430/323; 430/324; 430/256; 264/221
(58) Field of Classification Search
USPC .......................... 430/323, 324, 256; 264/221
See application file for complete search history.

(56) References Cited

U.S. PATENT DOCUMENTS

| | | | |
|---|---|---|---|
| 6,635,403 B2 | 10/2003 | Miyauchi et al. | |
| 6,849,558 B2 | 2/2005 | Schaper | |
| 6,899,838 B2 | 5/2005 | Lastovich | |
| 6,929,762 B2 | 8/2005 | Rubin | |
| 6,946,322 B2 | 9/2005 | Brewer | |
| 7,125,639 B2 | 10/2006 | Schaper | |
| 7,345,002 B2 | 3/2008 | Schaper | |
| 7,547,398 B2 | 6/2009 | Schmid et al. | |
| 7,981,814 B2 | 7/2011 | Schaper | |
| 2002/0123009 A1* | 9/2002 | Schaper | ........................ 430/323 |
| 2007/0128856 A1* | 6/2007 | Tran et al. | ..................... 438/637 |
| 2011/0058150 A1 | 3/2011 | Schaper | |

* cited by examiner

*Primary Examiner* — Cynthia Kelly
*Assistant Examiner* — Caleen Sullivan
(74) *Attorney, Agent, or Firm* — Thomas Schneck; Mark Protsik

(57) ABSTRACT

A method of forming a master from smaller originals is provided for use in replicating molecular transfer lithography (M×L) templates, cured polymer films for imprinting molds or cured polymer films for photonic applications. A coating layer on a base substrate is successively patterned in two or more areas using dissoluble conformal templates created from original master patterns, wherein areas not being patterned with a template at any given stage of the process are protected with photoresist and templates applied to open areas also partially overlap the resist-protected areas. Overlapping minimizes seam formation in the overall pattern. Templates have etch-resistant functional material that adheres to the coating layer on the base substrate. After dissolving the template to leave only the functional material in the pattern of the original master, etching of the coating layer transfers the pattern to the etched coating layer of the base substrate.

14 Claims, 5 Drawing Sheets

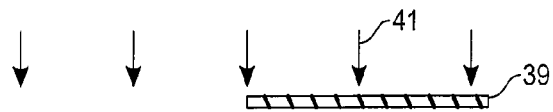
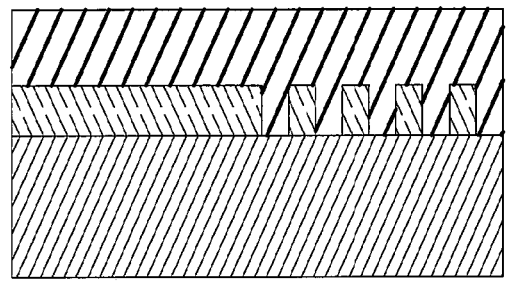
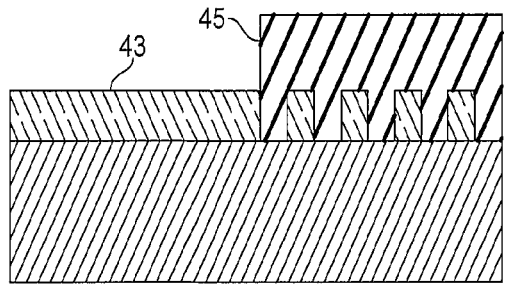
Fig. 1G  Fig. 1H
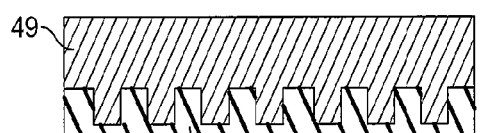
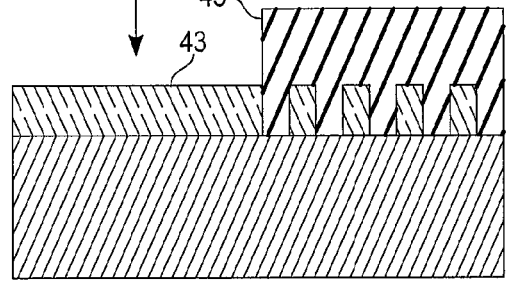
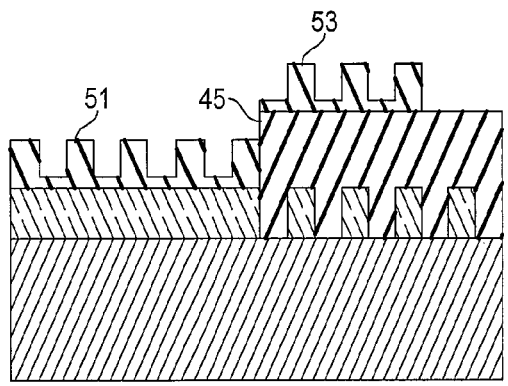
Fig. 1I  Fig. 1J
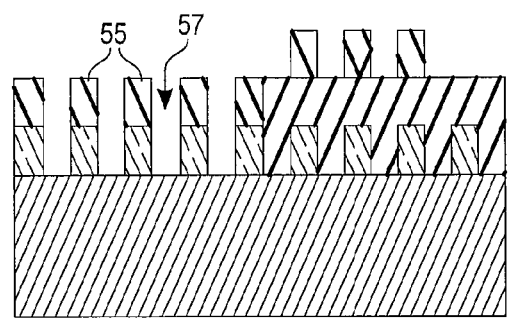
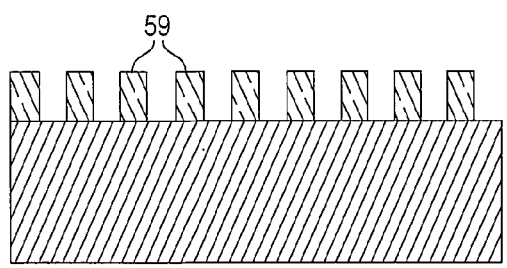
Fig. 1K  Fig. 1L

METHOD OF FORMING LARGE-AREA MASTERS FOR REPLICATION OF TRANSFER LITHOGRAPHY TEMPLATES

TECHNICAL FIELD

The present invention relates to fabrication of nano- or micro-structural pattern surface features on transfer lithography templates and their masters.

BACKGROUND ART

Lithography processes are used in the manufacture of a variety of devices having one or more layers with micro-scale or nano-scale features. The current technology is challenged to meet the needs of high resolution (e.g. sub-50 nm feature sizes) and large area patterning (e.g. on substrates greater than 100 mm diameter).

Molecular transfer lithography (MxL) is one technique that can obtain the needed high resolution. Patterning of features is performed using dissolvable templates. For example, U.S. Pat. Nos. 6,849,558; 7,125,639; 7,345,002 and 7,981,814; and U.S. Patent Application Publication No. 2011/0058150 describe templates and a patterning procedure in which a material is transferred from a template to a substrate by adhesion, and then the template's polyvinyl alcohol (PVA) backing is dissolved in water. There are many possible types of transferred materials as the basic requirement is that the material coatings have minimal interaction with the PVA template. Among the types of materials that can be transferred with PVA templates include a polymer film, such as one with etch-resistant properties from which a pattern can subsequently be etched into the substrate, and vapor phase deposited films that have end-use properties such as a metal or dielectric layers.

MxL templates are themselves formed from a master that defines a target pattern to be replicated. However, a large area master is needed to create large area templates. At present, the areas that can be patterned by an optical photolithography scheme to create an original master for MxL template replication is limited to approximately 300 mm wafer diameter resulting in an approximately 200 mm square, and even smaller for original masters created by e-beam or other kinds of lithography. In order to create larger masters, multiple originals must be combined in some fashion. The most straightforward method involves simply tiling several original masters together, but can leave gaps or seam lines in the configuration at tile boundaries. Also, any difference in height between adjacent masters can cause defects in the pattern transferred to the new larger area master.

In U.S. Pat. No. 7,547,398 to Schmid et al., a self-aligned process for fabricating imprint templates is described which enables co-planarization of structures (e.g., micro-lenses) that are created in multiple independent etch steps with different portions unmasked. Co-planarization is needed when the various etches expose patterns to particular etching conditions, so that the various structures may exist at different planes or elevations relative to the template surface. Accordingly, "higher" structures must then be exposed to anisotropic etching to reduce their overall elevation while preserving the structural topography. There is no indication of patterning of high resolution features over large areas, nor any indication of how the technique might be used to avoid forming any gaps or seams between adjacent protected resist fields or unmasked aperture portions. As described it appears that it would suffer the same seam formation problem at boundaries as other tiling techniques, with an improvement from performing a subsequent an isotropic etch to obtain co-planarization.

SUMMARY DISCLOSURE

A method of forming a master starts with the fabrication of "original" masters, e.g. using advanced photolithography with a photomask and etching tools, then using molecular transfer lithography to replicate patterns from one or more original masters onto a larger substrate. In particular, a base substrate is provided with an etchable coating layer thereon, wherein the base substrate has an area larger than that of the patterns on the originals. A photoresist layer is applied over the base substrate and then patterned to leave open a first portion of the etchable coating layer and to cover a second portion of the etchable coating layer with the photoresist material. A dissoluble patterned template created from one of the original masters and coated with functional material, which has etch resistance properties, is contacted conformally onto the first (open) portion of the etchable coating layer to adhere the patterned functional material to the coating layer. The template also contacts a portion of the second photoresist covered portion, i.e. there is a certain amount of overlap extending beyond just the open area. The template is then dissolved. The coating layer is dry etched wherever it is exposed, i.e. wherever it is covered neither by the photoresist in the second area nor by the functional material. Thus, the pattern from the template has been transferred to the first portion of the coating layer. The photoresist and functional material is removed and new photoresist is applied then patterned to leave open the second portion of the etchable coating layer while covering the already patterned first portion of the coating layer. Another dissoluble patterned template created from either the same or another one of the original masters and likewise coated with functional material is contacted onto the second (open) portion of the etchable coating layer to adhere the patterned functional material to the coating layer. This template also overlaps the photoresist in the covered first portion beyond the open second portion of the coating layer. The template is then dissolved leaving just the photoresist and functional material, and the second portion of the coating material is then dry etched wherever exposed. Thus the pattern from that second template is transferred to the second portion of the coating layer. The photoresist and functional material is then removed.

Due to the conformal patterning nature of the MxL method, the seam line caused at the boundary of the masked and unmasked portion is minimized. The photoresist material may be a minimal height resist. To achieve further a minimal seam line, a stage that is capable of precise placement of the blanking areas can be used, and alignment marks may be used to precisely place the template patterns over the open areas in the resist onto the coating layer to be etched.

The method may be repeated to fully pattern the master substrate. If the pattern is itself repetitive, the patterned transferred to the substrate may be used to create templates for patterning adjacent stripes of the substrate by ordering columns and rows of patterns.

After its formation, the master can be used as a casting surface for replication of polymer films, such as PVA templates or other templates formed by a curing process.

BRIEF DESCRIPTION OF THE DRAWINGS

FIGS. 1A-1L are schematic side sectional views showing a process flow for forming a seamless large-area master in accord with the present invention.

DETAILED DESCRIPTION

With reference to FIGS. 1A-1L, a master of micro-structures and/or nano-structures is fabricated from one or more smaller original masters in a manner that minimizes seams. The main applications involve creation of large-area masters having linear dimensions greater than about 300 mm size, which are formed by the present invention from smaller originals of, for example, 100 mm to 200 mm size. However, the disclosed technique can also be used to stitch together smaller originals (e.g., 20 mm-size sample fields created by e-beam lithography) to create masters that are not necessarily of large area.

The master may be used, e.g. in the making of wire-grid polarizers (WGP) or the like, wherein the pattern of surface structures could define gratings and lattices from a silicon master substrate patterned with electron beam lithography or optical lithography. In that case, only a single original master is needed to replicate the pattern over the larger area. However, the process is also capable of being employed where some or all of multiple smaller originals are unique and laid down successively in different areas when patterning the large-area master.

In either case, a multi-pass procedure uses photolithography, molecular transfer lithography (MxL) and etching to form a larger master from one or more smaller originals, wherein use of overlapping successive resist areas and overlapping of MxL templates over those resist areas blanked by photolithography minimizes the creation of unwanted seams.

Figure 1A:
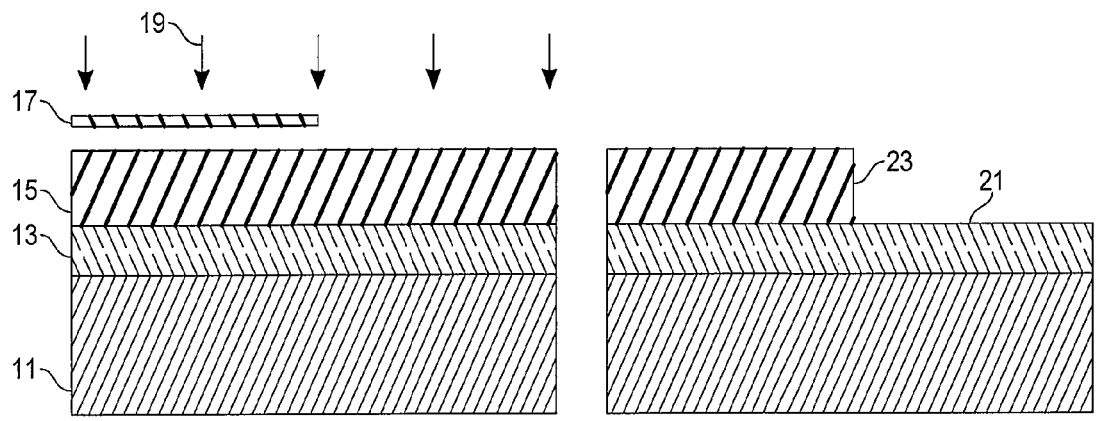

As seen in FIG. 1A, a large area substrate 11 is coated with a layer 13, which will be dry etched, to a thickness specified in accordance with its application and intended use. The base substrate 11, such as glass, can contain multiple layers 13 that serve various purposes such as etch stop layers or hard masks. The layers 13 can be prepared with sputtering or other deposition techniques, such as chemical vapor deposition or evaporation.

Figure 1B:
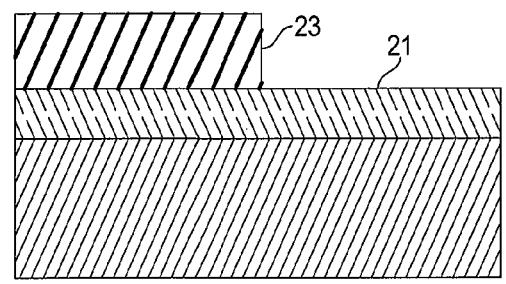

After the substrate 11 is deposited with thin films 13, a photoresist coating 15 is applied and optical photolithography (mask 17, expose 19, and develop) is used, as seen in FIG. 1B, to open-up portions 21 of the substrate 11 with its coating layers 13 in order to precisely define the edges 23 and, make available areas 21 that can be patterned.

Figure 1C:
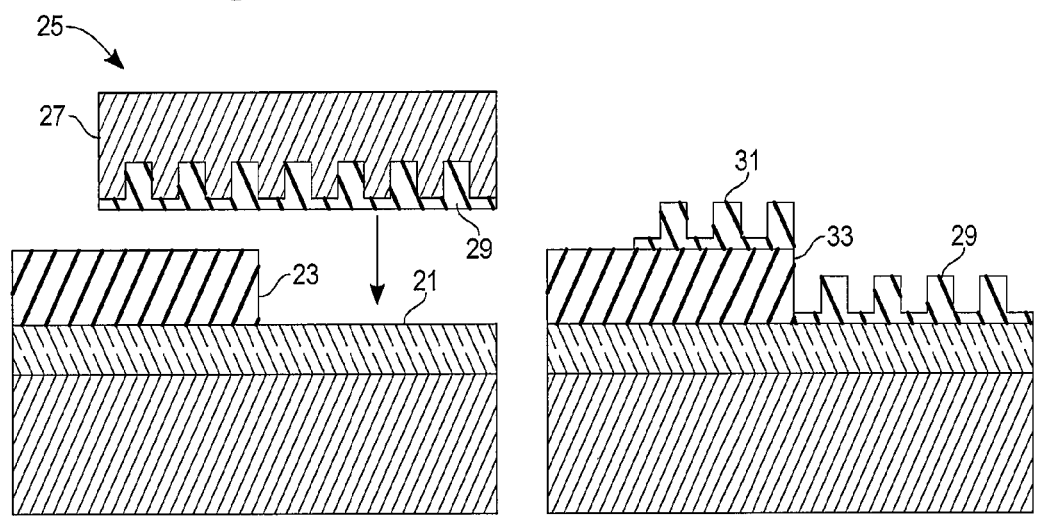
Figure 1D:
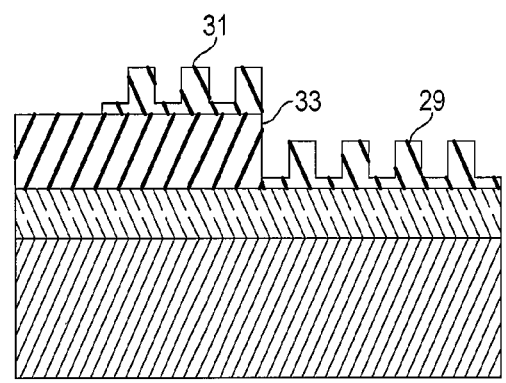

As seen in FIG. 1C, patterning of the exposed area 21 is carried out using a template 25 replicated from a smaller original master pattern. For example, a 300 mm diameter wafer can be used as the original master to produce templates 25 for use in the MxL procedure. Within the open areas the MxL method is used to transfer patterned resist 29 from the template 25 onto the exposed coating surface 21, as seen in FIG. 1D.

The MxL technique is implemented by coating the template's PVA backing 27 with the resist 29. The patterned backing 27 is formed from the original master, with resist 29 then being bonded onto the large-area master surface 21. In a practical situation, the edges rise over the edge 23 of the hardened resist from photolithography. The PVA template 25 is aligned to the underlying layer such that the pattern 29 is placed in an orientation on large area substrate consistent with the subsequent processing steps.

To place the pattern onto the substrate, a lamination tool can be used in which the resist on the flexible template is rolled onto the substrate. To achieve adhesion, a slight temperature is applied to the rollers, the substrate, or both the rollers and substrate.

Reducing the distortion of the pattern while overlapping the patterned resist over the edges of the protective resist may be minimized by orienting the direction of the pattern with the respect to the direction of the protective resist. In the case of grating lines, laminating the template pattern such that the lines of the grating pattern are parallel to the direction of the of the resist pattern will reduce distortion by improving the adhesion of the resist pattern at the base of the photoresist line, preventing pull-off of the line, for example, if it were set an angle to the protective resist. The direction of the lamination may also be used to minimize the distortion, by laminating down the protective layer and onto the substrate would improve the adhesion of the patterning resist onto the substrate. To further reduce distortion, the height of the protective resist layer should be minimized by using a minimal amount to protect the surface after the etching process is applied to the targeted area. The height of the protective resist is proportional to the width of distortion, and therefore should be minimized.

After the master is fabricated, it can be used for a variety of applications including fabricating a large template for molecular transfer lithography procedure. It can also be used as a master for a molding application in which polymer is spread over its surface, cured, and then separated. It can also be used as an imprinting master to press into molded materials, form an indentation after separation.

Figure 1E:
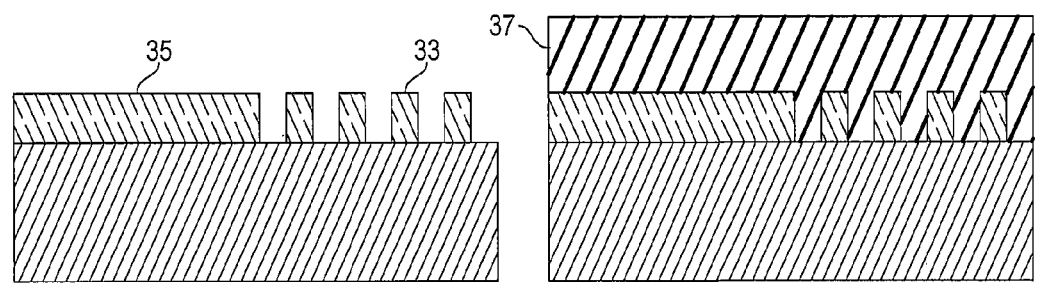

As seen in FIG. 1E, a dry etching step is used to transfer the resist pattern 33 into the underlying layer 35 on the substrate, stopping at the next layer. In preparation for the next step, the resists, including the MxL resist 29 and the photolithography resist 23, are removed by ashing and cleaning steps.

Figure 1F:
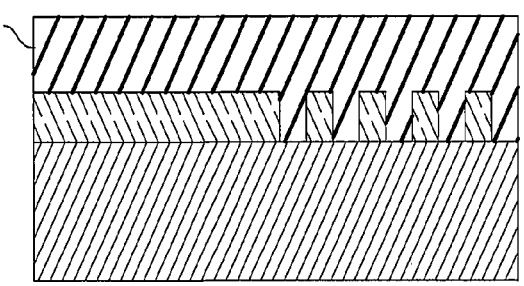

As seen in FIG. 1F, the previously patterned areas are then masked by a second pass of optical photolithography. Photoresist 37 is coated on the substrate surface and then, as seen in FIG. 1G, optical photolithography is used (mask 39, expose 41 and develop) to expose the areas 43, seen in FIG. 1H, that were previously unpatterned.

In FIG. 1I, a MxL template 47 is used as in the first pass of patterning (patterned PVA 49 and resist 51) to place a pattern (FIG. 1J) in the open areas 43. Alignment of the pattern may be performed by use of alignment marks on the substrate surface relative to alignment marks on the template.

As seen in FIG. 1K, after pattern placement, dry etching is then performed to transfer the resist pattern 51 into the underlying thin film 57. The resist 51 is then stripped off using an aching process, leaving the patterned structure 59 seen in FIG. 1L.

This patterning procedure may be repeated in a scaling process that forms masters covering even larger areas. One such method to pattern the entire substrate is indicated in FIGS. 2A-2E. The procedure extends the process flow just described by opening areas for patterning such that the adjacent areas are protected. In order to prevent the pattern from affecting the adjacent patterns, patches are patterned in an alternated fashion. Subsequent steps complete the patterning of the entire master.

Figure 2A:
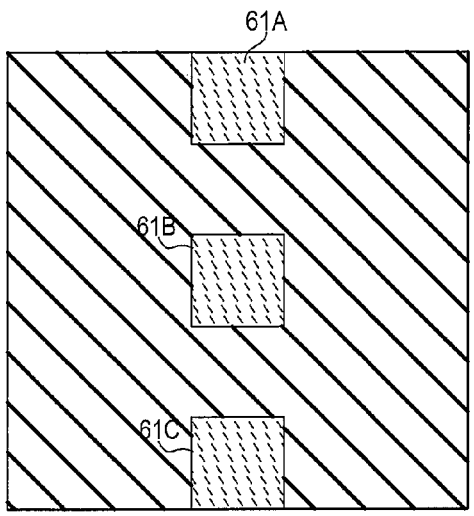
FIGS. 2A-2E are schematic top plan views showing a scaling process flow extending the method in FIGS. 1A-1L to systematically cover ever larger areas of a master.
Figure 2B:
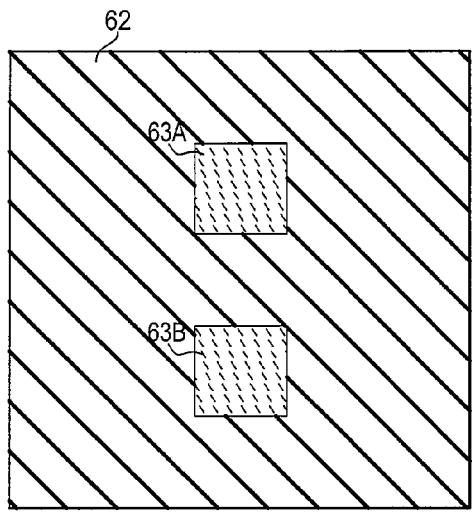
Figure 2C:
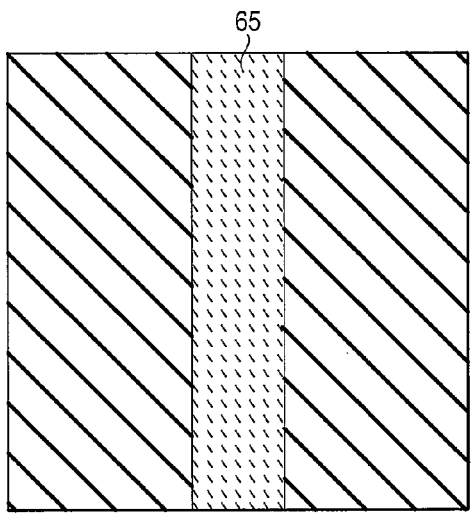
Figure 2D:
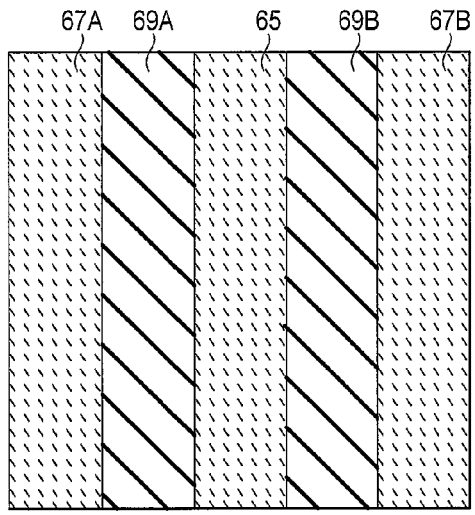
Figure 2E:
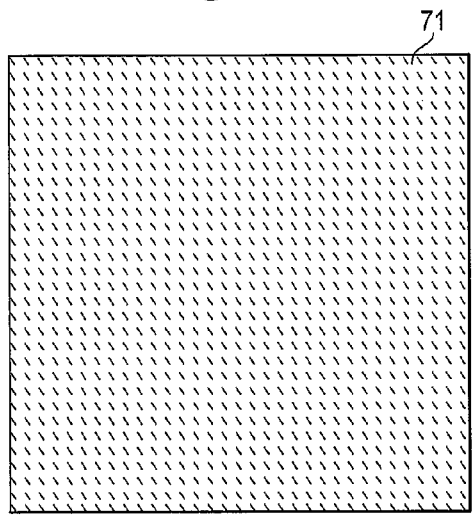

After the first set of areas (e.g. 61A-61C) is patterned and etched (FIG. 2A), it is protected with resist 62 and the adjacent areas (e.g. 63A-63B) within the column are opened using optical photolithography (FIG. 2B). The patterns are then placed using M×L procedure, followed by etching. This unit 65 then forms a sub-master (FIG. 2C) which can then be repeated column by column, e.g. starting with columns 67A and 67B with areas 65, 69A and 69B being masked (FIG. 2D), then repeating by patterning the previously masked columns 69A and 69B while masking the already patterned areas 65, 67A and 69B, to obtain a fully patterned substrate 71 (FIG. 2E).

Figure 3A:
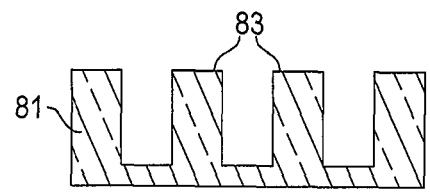
FIGS. 3A-3C are schematic side sectional views showing a basic process flow, using a large-area master made by the processes in FIGS. 1 and 2, for replicating PVA templates from that master by a casting operation.
Figure 3B:
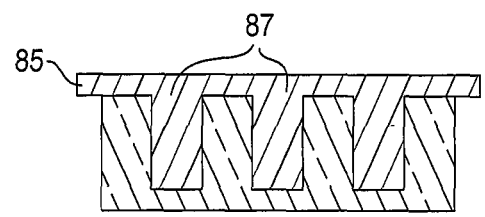
Figure 3C:
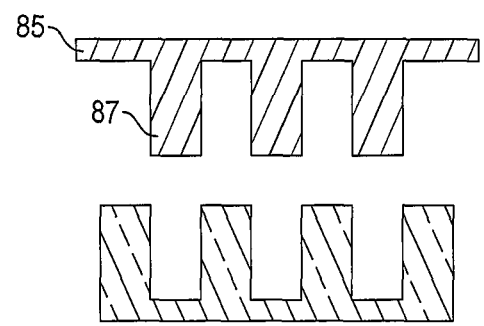

In FIGS. 3A-3C, the method of producing a water-dissolvable template from a master is depicted. As seen in FIG. 3A, starting from a master substrate 81 that defines the targeted pattern topography 83, a polyvinyl alcohol (PVA) film forming solution is spin cast (FIG. 3B) over the master substrate 81, filling the voids and recesses. The casting solvents (water) evaporate at room-temperature to form a thin film 85 with a thickness and drying period dependent upon the rotation speed, time, and ambient. The solid sheet of PVA includes a surface pattern 87 which is a mirror of the pattern 83 from the master. After separating the spin-cast PVA template from the master (FIG. 3C), the pattern 87 in the template is ready to receive resist.

In FIGS. 4A-4D, once the polyvinyl alcohol (PVA) template 85 with a surface pattern 87 has been prepared, it may be used in a molecular transfer lithography (M×L) procedure to pattern a substrate 91. The inventor's prior patents describe several possible M×L processes using dissolvable (or destroyable) templates, but the particular procedure that works best comprises transferring etch resistant or other functional materials 89 to a substrate by an adhesion operation followed by dissolution in water of the polyvinyl alcohol (PVA) template 85, leaving the pattern of functional material 89 on the substrate 91.

The M×L procedure with its dissolvable template offers several advantages over alternative methods, such as nano-imprint lithography with its hard template made of quartz, or soft lithography with its soft embossing template made of an elastomeric material or other fluorine based material. The dissolvable template enables new ways of patterning as compared to hard or soft templates, which do not dissolve, but rather emboss. The advantages include: (1) a conformal template; (2) large-area patterning; (3) a material transfer process; (4) eliminates defect propagation; (5) eliminates de-molding and its yield problems; (6) fewer steps than alternative methods; (7) eliminates the handling of wet resist in the fab as the template is pre-coated with resist or functional films; (8) eliminates coating the substrate with resist; (9) transfers a wide range of functional materials including conductive and dielectric materials; (10) ultra-high resolution, high modulus template; (11) ultra-high aspect ratios; (12) cost effective; (13) multi-level structures; (14) water-dissolvable for an environmentally friendly approach.

Figure 4A:
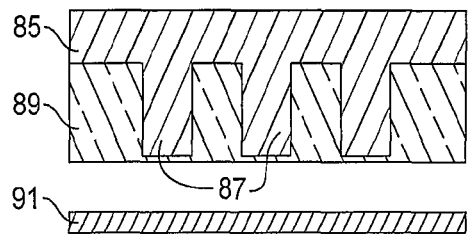
FIG. 4A-4D are schematic side sectional views showing a molecular transfer lithography (MxL) transfer procedure for patterning a substrate with a PVA template made by a process as in FIG. 3.

As seen in FIG. 4A, the process begins with coating the dissolvable PVA template 85 with materials 89 to be transferred. The template is coated with the functional material, performed for example by spin-casting, but which does not dissolve the PVA template, and is then dried and cured to form a template with a dry coating available for nano-patterning by a molecular transfer operation. From earlier work, we have demonstrated that it is possible to coat the PVA template with resist, cure it and then store it for long periods of time, even up to a year, before bonding it to the substrate. It is an important result because through this remote processing approach, the handling of resist within the fabrication facility is eliminated thereby solving problems with containing and disposing hazardous materials that require special precautionary methods, and it also eliminates extra operational steps, namely resist coating and curing, thereby increasing throughput and lowering costs.

Figure 4B:
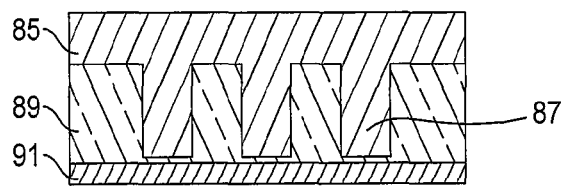
Figure 4C:
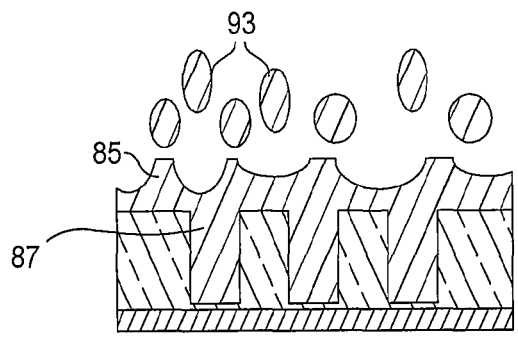
Figure 4D:
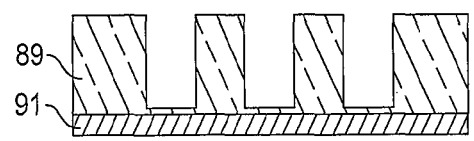

The functional material-coated PVA template 85 is bonded onto substrate 91 using an adhesion operation (FIG. 4B). Tools are available to help perform the adhesion operation. The PVA template 85 is then dissolved away in water 93 (FIG. 4C) to leave just the functional material 89 patterned on the substrate 91 (FIG. 4D). Often a so-called "residual layer" of functional material remains at the base of the trench after adhesion to the substrate 91. For an application in which the functional material is used for etch-resistance to transfer the pattern of the original master into the substrate, the residual layer must be removed to transfer the pattern to the substrate. To remove the residual layer, a dry anisotropic etch process is preferred, such as the etch procedure involving a $CF_4$ plasma used to remove the BARC (bottom anti-reflective coating) layer in photolithography.

The present invention is applicable to the manufacturing of micro-scale and nano-scale devices that require high resolution patterning over a large area. Such devices include integrated circuits, displays, photonics, optoelectronics, high density memory storage, micro-fluidics, biological sensors, MEMs, and emerging nanotechnology devices including solar cell and RFID designs. The lithography, technologies that pattern these devices continue to be challenged by increasing demands for complex designs, higher resolution, challenging substrate topography, and large area substrates, all produced at higher volumes with lower price points. The solution provided by the present invention allows large area masters for replicating M×L pattern templates for meeting these challenges. The method of making such masters results in uniform patterning of a surface over the entire area with minimal seam lines.

What is claimed is:

1. A method of forming a master, comprising:
   creating an original master pattern for replication of dissoluble patterned templates;
   providing a base substrate with an etchable coating layer thereon, the base substrate having an area larger than the original master pattern;
   applying and patterning a photoresist layer over the base substrate so as to leave open a first portion of the etchable coating layer and to cover a second portion of the etchable coating layer with the photoresist layer;
   contacting a dissoluble patterned template onto the first portion of the etchable coating layer to adhere a patterned functional material to the coating layer, then dissolving the template and dry etching the residual layer of the functional material to expose the coating layer in correspondence to the pattern;
   etching the coating layer in areas neither covered by the photoresist layer nor the functional material so as to transfer a pattern to the first portion of the coating layer;
   removing the photoresist layer and the functional material;
   applying and patterning a second photoresist layer over the base substrate so as to leave open the second portion of the etchable coating layer and to cover the first portion of the coating layer and its transferred pattern with the photoresist layer;
   contacting another dissoluble patterned template onto the second portion of the etchable coating layer in a specified alignment with the transferred pattern of the first portion so to adhere a patterned functional material to the second portion of the coating layer, then dissolving the template and dry etching the residual layer of the functional material to expose the coating layer in correspondence to the pattern;

etching the coating layer in areas neither covered by the second photoresist layer nor the functional material so as to transfer a pattern to the second portion of the coating layer; and removing the photoresist layer and the functional material.

2. The method as in claim 1, wherein patterned templates are contacted so as to also overlap a portion of the photoresist layer.

3. The method as in claim 1, wherein the photoresist layer has a minimum height or thickness needed to transfer the patterned functional material without distortion while still protecting the coating layer covered by the photoresist from being etched.

4. The method as in claim 1, wherein the coating layer is comprised of a film stack including a hard mask layer, an etching layer, and an etch-stop layer.

5. The method as in claim 4, wherein the hard mask layer is only etched during the first and second portions, and then the etching layer is etched after removing the photoresist layer and functional material.

6. The method as in claim 1, wherein the dissoluble patterned templates comprise patterned functional material on a polyvinyl alcohol substrate soluble in water.

7. The method as in claim 1, wherein the etching of the coating layer is a dry etch.

8. The method as in claim 1, wherein the patterned templates include alignment marks.

9. The method as in claim 1, wherein the base substrate has an area greater than 100 mm square.

10. The method as in claim 1, wherein the first and second portions of the coating layer together form a first stripe on the base substrate, the pattern transferred to the coating layer in that first stripe forming a sub-master for replication of dissoluble patterned templates, the steps of applying and patterning a photoresist, contacting a dissoluble patterned template, etching the coating layer and removing the photoresist and functional, material being repeated on adjacent stripes over the base substrate using patterned templates replicated from the sub-master.

11. The method as in claim 1, further comprising applying a dissolvable template material to the patterned base substrate, curing the template material, and separating the cured template material from the base substrate, so as to use the base substrate as a master to replicate at least one patterned template for use in molecular transfer lithography.

12. The method as in claim 11, wherein the template material when cured forms a water-soluble polyvinyl alcohol (PVA) template with a reverse pattern in its surface replicated from the base substrate.

13. The method as in claim 11, further comprising applying etch resistant functional material to the surface of the at least one patterned template and curing said functional material.

14. The method as in claim 1, further comprising applying a curable polymer to the patterned base substrate, curing the polymer, and separating the cured polymer from the base substrate, so as to use the base substrate as a master to form at least one plastic mold with the surface pattern replicated from the base substrate.

\* \* \* \* \*